United States Patent
Shiratake (10) Patent No.: US 8,085,573 B2
(45) Date of Patent: Dec. 27, 2011

(54) FERROELECTRIC MEMORY

(75) Inventor: Shinichiro Shiratake, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 118 days.

(21) Appl. No.: 12/562,951

(22) Filed: Sep. 18, 2009

(65) Prior Publication Data

US 2010/0118586 A1 May 13, 2010

(30) Foreign Application Priority Data

Nov. 12, 2008 (JP) ................... 2008-289712

(51) Int. Cl.
*G11C 11/22* (2006.01)
*G11C 7/02* (2006.01)
(52) U.S. Cl. .................... 365/145; 365/210.1
(58) Field of Classification Search .............. 365/145, 365/49.13, 200, 185.11
See application file for complete search history.

(56) References Cited

U.S. PATENT DOCUMENTS

| 5,703,817 | A | 12/1997 | Shiratake et al. | |
|---|---|---|---|---|
| 5,959,908 | A | 9/1999 | Shiratake | |
| 7,791,922 | B2 * | 9/2010 | Doumae et al. | 365/200 |
| 7,830,696 | B2 * | 11/2010 | Shiratake | 365/145 |
| 2004/0062134 | A1 * | 4/2004 | Kato et al. | 365/232 |
| 2004/0252542 | A1 * | 12/2004 | Hoya et al. | 365/145 |
| 2005/0063225 | A1 * | 3/2005 | Takashima | 365/199 |
| 2007/0047341 | A1 * | 3/2007 | Domae et al. | 365/200 |
| 2008/0186754 | A1 * | 8/2008 | Shiratake | 365/145 |
| 2010/0014341 | A1 * | 1/2010 | Takashima | 365/145 |

OTHER PUBLICATIONS

Explanation of Non-English Language References.

* cited by examiner

*Primary Examiner* — VanThu Nguyen
*Assistant Examiner* — Khamdan Alrobaie
(74) *Attorney, Agent, or Firm* — Knobbe, Martens, Olson & Bear LLP (57) ABSTRACT

A ferroelectric memory of an embodiment of the present invention includes a plurality of units, in each of which a ferroelectric capacitor and a transistor are connected to each other in parallel. The memory includes first and second memory cell arrays, first and second bit lines arranged in the first and second memory cell arrays, respectively, first and second blocks connected to the first bit line, and including $N_1$ units and $N_2$ units, respectively, where $N_1$ and $N_2$ are positive integers, third and fourth bit lines arranged in the first and second memory cell arrays, respectively, third and fourth blocks connected to the third bit line, and including $N_3$ units and $N_4$ units, respectively, where $N_3$ and $N_4$ are positive integers, first to fourth redundant blocks respectively connected to the first to fourth bit lines, and to be used for repair of the first to fourth blocks, and a sense amplifier selectively connectable to one of the first and second bit lines, and selectively connectable to one of the third and fourth bit lines.

19 Claims, 10 Drawing Sheets

| DEFECTIVE WL | UNIT | PL | REPLACEMENT UNIT | REPLACEMENT SWL | REPLACEMENT SPL |
|---|---|---|---|---|---|
| WL$_1$ | U$_1$ | PL$_1$ | UX$_1$ | SWL$_1$ | SPL$_1$ |
|  | U$_9$ | PL$_2$ | UX$_{11}$ | SWL$_1$ | SPL$_3$ |
| WL$_2$ | U$_2$ | PL$_1$ | UX$_2$ | SWL$_2$ | SPL$_1$ |
|  | U$_{10}$ | PL$_2$ | UX$_{12}$ | SWL$_2$ | SPL$_3$ |
| WL$_3$ | U$_3$ | PL$_1$ | UX$_3$ | SWL$_3$ | SPL$_1$ |
|  | U$_{11}$ | PL$_2$ | UX$_{13}$ | SWL$_3$ | SPL$_3$ |
| WL$_4$ | U$_4$ | PL$_1$ | UX$_6$ | SWL$_6$ | SPL$_2$ |
|  | U$_{12}$ | PL$_2$ | UX$_{14}$ | SWL$_4$ | SPL$_3$ |
| WL$_5$ | U$_5$ | PL$_1$ | UX$_7$ | SWL$_7$ | SPL$_2$ |
|  | U$_{13}$ | PL$_2$ | UX$_{15}$ | SWL$_5$ | SPL$_3$ |
| WL$_6$ | U$_6$ | PL$_1$ | UX$_8$ | SWL$_8$ | SPL$_2$ |
|  | U$_{14}$ | PL$_2$ | UX$_{18}$ | SWL$_8$ | SPL$_4$ |
| WL$_7$ | U$_7$ | PL$_1$ | UX$_9$ | SWL$_9$ | SPL$_2$ |
|  | U$_{15}$ | PL$_2$ | UX$_{19}$ | SWL$_9$ | SPL$_4$ |
| WL$_8$ | U$_8$ | PL$_1$ | UX$_{10}$ | SWL$_{10}$ | SPL$_2$ |
|  | U$_{16}$ | PL$_2$ | UX$_{20}$ | SWL$_{10}$ | SPL$_4$ |

| DEFECTIVE WL | UNIT | PL | REPLACEMENT UNIT | REPLACEMENT SWL | REPLACEMENT SPL |
|---|---|---|---|---|---|
| WL$_1$ | U$_1$ | PL$_1$ | UX$_1$ | SWL$_1$ | SPL$_1$ |
|  | U$_9$ | PL$_2$ | UX$_{11}$ | SWL$_1$ | SPL$_3$ |
| WL$_2$ | U$_2$ | PL$_1$ | UX$_2$ | SWL$_2$ | SPL$_1$ |
|  | U$_{10}$ | PL$_2$ | UX$_{12}$ | SWL$_2$ | SPL$_3$ |
| WL$_3$ | U$_3$ | PL$_1$ | UX$_{13}$ | SWL$_3$ | SPL$_1$ |
|  | U$_{11}$ | PL$_2$ | UX$_{13}$ | SWL$_3$ | SPL$_3$ |
| WL$_4$ | U$_4$ | PL$_1$ | UX$_4$ | SWL$_6$ | SPL$_1$ |
|  | U$_{12}$ | PL$_2$ | UX$_{16}$ | SWL$_4$ | SPL$_4$ |
| WL$_5$ | U$_5$ | PL$_1$ | UX$_5$ | SWL$_7$ | SPL$_1$ |
|  | U$_{13}$ | PL$_2$ | UX$_{17}$ | SWL$_5$ | SPL$_4$ |
| WL$_6$ | U$_6$ | PL$_1$ | UX$_8$ | SWL$_8$ | SPL$_2$ |
|  | U$_{14}$ | PL$_2$ | UX$_{18}$ | SWL$_8$ | SPL$_4$ |
| WL$_7$ | U$_7$ | PL$_1$ | UX$_9$ | SWL$_9$ | SPL$_2$ |
|  | U$_{15}$ | PL$_2$ | UX$_{19}$ | SWL$_9$ | SPL$_4$ |
| WL$_8$ | U$_8$ | PL$_1$ | UX$_{10}$ | SWL$_{10}$ | SPL$_2$ |
|  | U$_{16}$ | PL$_2$ | UX$_{20}$ | SWL$_{10}$ | SPL$_4$ |

FERROELECTRIC MEMORY

CROSS REFERENCE TO RELATED APPLICATION

This application is based upon and claims the benefit of priority from the prior Japanese Patent Application No. 2008-289712, filed on Nov. 12, 2008, the entire contents of which are incorporated herein by reference.

BACKGROUND OF THE INVENTION

1. Field of the Invention

The present invention relates to a ferroelectric memory, for example, a ferroelectric memory of an RC-parallel-unit serial connection type.

2. Background Art

An RC-parallel-unit serial connection type is known as a type of an FeRAM (Ferroelectric Random Access Memory). The FeRAM of the RC-parallel-unit serial connection type includes serially connected structures in each of which a ferroelectric capacitor and a transistor are connected in parallel (the structures are called "RC parallel units"). The RC parallel units will be simply referred to as "units", hereinafter.

In the FeRAM of the RC-parallel-unit serial connection type, two blocks, each of which includes plural units, often share a plate line.

It is now assumed that first and second blocks share a first plate line and respectively include $N_1$ and $N_2$ units, and that third and fourth blocks share a second plate line and respectively include $N_3$ and $N_4$ units. With regard to these blocks, it is assumed that the first and third blocks are located on the same side, and that the second and fourth blocks are located on the same side.

Conventionally, values of $N_1$, $N_2$, $N_3$, and $N_4$ are normally set to be equal for ease of design. Further, the value of $N_1$, $N_2$, $N_3$, and $N_4$ ($N_1=N_2=N_3=N_4$) is normally set in power series of 2. Recently, however, following the progress of high integration of the FeRAM, etching pitches of memory cells, bit lines, word lines, and plate lines are narrower. As a result, it is difficult to arrange plate lines generally made of Cu or Al to satisfy $N_1=N_2$. Therefore, cases where the plate lines are arranged to satisfy $N_1 \neq N_3$ have increased.

Accordingly, in the FeRAM of the RC-parallel-unit serial connection type, cases of mixing blocks different in the number of the units have increased. For example, the values of $N_1$ to $N_4$ are set to satisfy $N_1+N_2=N_3+N_4=8$, $N_1=3$, $N_2=5$, $N_3=5$, and $N_4=3$.

In such a case, a method for redundancy repair is a problem. To reduce a circuit area, redundant cells for the FeRAM are preferably provided only on either the first and third block side or the second and fourth block side. For example, if the redundant cells are provided only on the first and third block side, five redundant cells are connected to the first block. Further, three redundant cells are connected to the third blocks according to symmetry of a memory cell array. In this case, it is sufficient to use the former five redundant cells to repair the first and second blocks. However, the problem is that it is insufficient to use only the latter three redundant cells to repair the third and fourth blocks.

JP-A H9-148533 (KOKAI) describes an example of a semiconductor memory device having a function of repairing a defect in a memory cell array. In the semiconductor memory device described in the JP-A H9-148533, an access to a word line or a bit line including a defective part in a normal memory cell array is replaced by an access to a word line or a bit line in a redundant memory cell array.

SUMMARY OF THE INVENTION

An aspect of the present invention is, for example, a ferroelectric memory including a plurality of units, in each of which a ferroelectric capacitor and a transistor are connected to each other in parallel, the memory including first and second memory cell arrays, first and second bit lines arranged in the first and second memory cell arrays, respectively, first and second blocks connected to the first bit line, and including $N_1$ units and $N_2$ units, respectively, where $N_1$ and $N_2$ are positive integers, a first plate line arranged in the first memory cell array, and connected to the first and second blocks in common, third and fourth bit lines arranged in the first and second memory cell arrays, respectively, third and fourth blocks connected to the third bit line, and including $N_3$ units and $N_4$ units, respectively, where $N_3$ and $N_4$ are positive integers, a second plate line arranged in the first memory cell array, and connected to the third and fourth blocks in common, a first redundant block connected to the first bit line, including at least $N_1$ units, and to be used for repair of the first block, a second redundant block connected to the second bit line, including at least $N_2$ units, and to be used for repair of the second block, a third redundant block connected to the third bit line, including at least $N_3$ units, and to be used for repair of the third block, a fourth redundant block connected to the fourth bit line, including at least $N_4$ units, and to be used for repair of the fourth block, first to fourth redundant plate lines connected to the first to fourth redundant blocks, respectively, and a sense amplifier selectively connectable to one of the first and second bit lines, and selectively connectable to one of the third and fourth bit lines.

DESCRIPTION OF THE EMBODIMENTS

Embodiments of the present invention will be described with reference to the drawings.

First Embodiment

Figure 1:
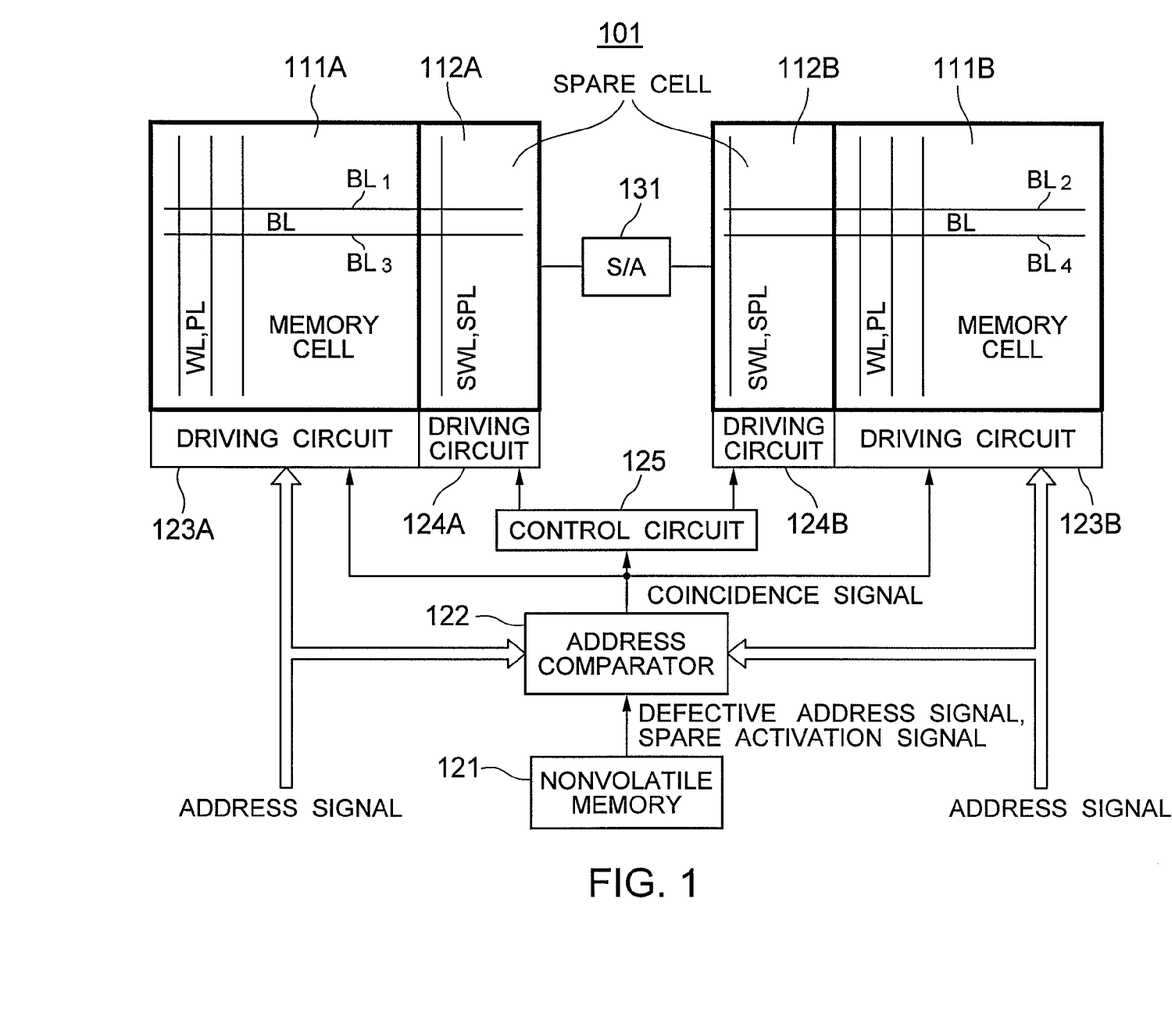
FIG. 1 is a schematic diagram showing a circuit configuration of a ferroelectric memory according to a first embodiment.

FIG. 1 is a schematic diagram showing a circuit configuration of a ferroelectric memory 101 according to a first embodiment. The ferroelectric memory 101 shown in FIG. 1 includes first and second memory cell arrays 111A and 111B, first and second spare cell arrays 112A and 112B, a nonvolatile memory 121 such as a fuse, an address comparator 122, first and second line driving circuits 123A and 123B, first and second spare line driving circuits 124A and 124B, a spare line control circuit 125, and a sense amplifier 131.

Each of the first and second memory cell arrays 111A and 111B includes plural memory cells. In this embodiment, each of the first and second memory cell arrays 111A and 111B includes 256×256 memory cells. In each of the first and second memory cell arrays 111A and 111B, plural bit lines BLs extending in a crosswise direction of paper, plural word lines WLs extending in a lengthwise direction of the paper, and plural plate lines PLs extending in the lengthwise direction of the paper are arranged.

Each of the first and second spare cell arrays 112A and 112B includes plural spare cells. In this embodiment, each of the first and second spare cell arrays 112A and 112B includes 5×256 spare cells. In each of the first and second spare cell arrays 112A and 112B, plural bit lines BLs extending in the crosswise direction of the paper, plural spare word lines SWLs extending in the lengthwise direction of the paper, and plural spare plate lines SPLs extending in the lengthwise direction of the paper are arranged.

The bit lines BLs are shared between the first memory cell array 111A and the first spare cell array 112A, and between the second memory cell array 111B and the second spare cell array 112B. FIG. 1 shows first and third bit lines $BL_1$ and $BL_3$ arranged in the first memory cell array 111A and the first spare cell array 112A, and second and fourth bit lines $BL_2$ and $BL_4$ arranged in the second memory cell array 111B and the second spare cell array 112B.

The spare word lines SWLs and the spare plate lines SPLs are used for redundancy repair. These lines are examples of redundant word lines and redundant plate lines of the present invention.

A defective address signal and a spare activation signal are stored in the nonvolatile memory 121. If the spare activation signal is "H" (High), the address comparator 122 compares an address signal with the defective address signal. If these signals coincide, the address comparator 122 outputs a coincidence signal to the spare line control circuit 125 and the first and second line driving circuits 123A and 123B. Each of the first and second line driving circuits 123A and 123B deactivates one of the word lines WLs and one of the plate lines PLs according to the coincidence signal. On the other hand, each of the first and second spare line driving circuits 124A and 124B activates one of the spare word lines SWLs and one of the spare plate lines SPLs under control of the spare line control circuit 125 that receives the coincidence signal. In this embodiment, the defective address signal is assumed as a signal that indicates an address of a word line.

The sense amplifier 131 is configured to read data stored in a selected cell by detecting and amplifying a potential change in each bit line BL. The sense amplifier 131 can read the stored data from each of the memory cells in the first and second memory cell arrays 111A and 111B or from each of the spare cells in the first and second spare cell arrays 112A and 112B.

As described later, the ferroelectric memory 101 shown in FIG. 1 is an FeRAM of an RC-parallel-unit serial connection type. Each of the memory cells and the spare cells shown in FIG. 1 correspond to an RC parallel unit to be described later.

Figure 2:
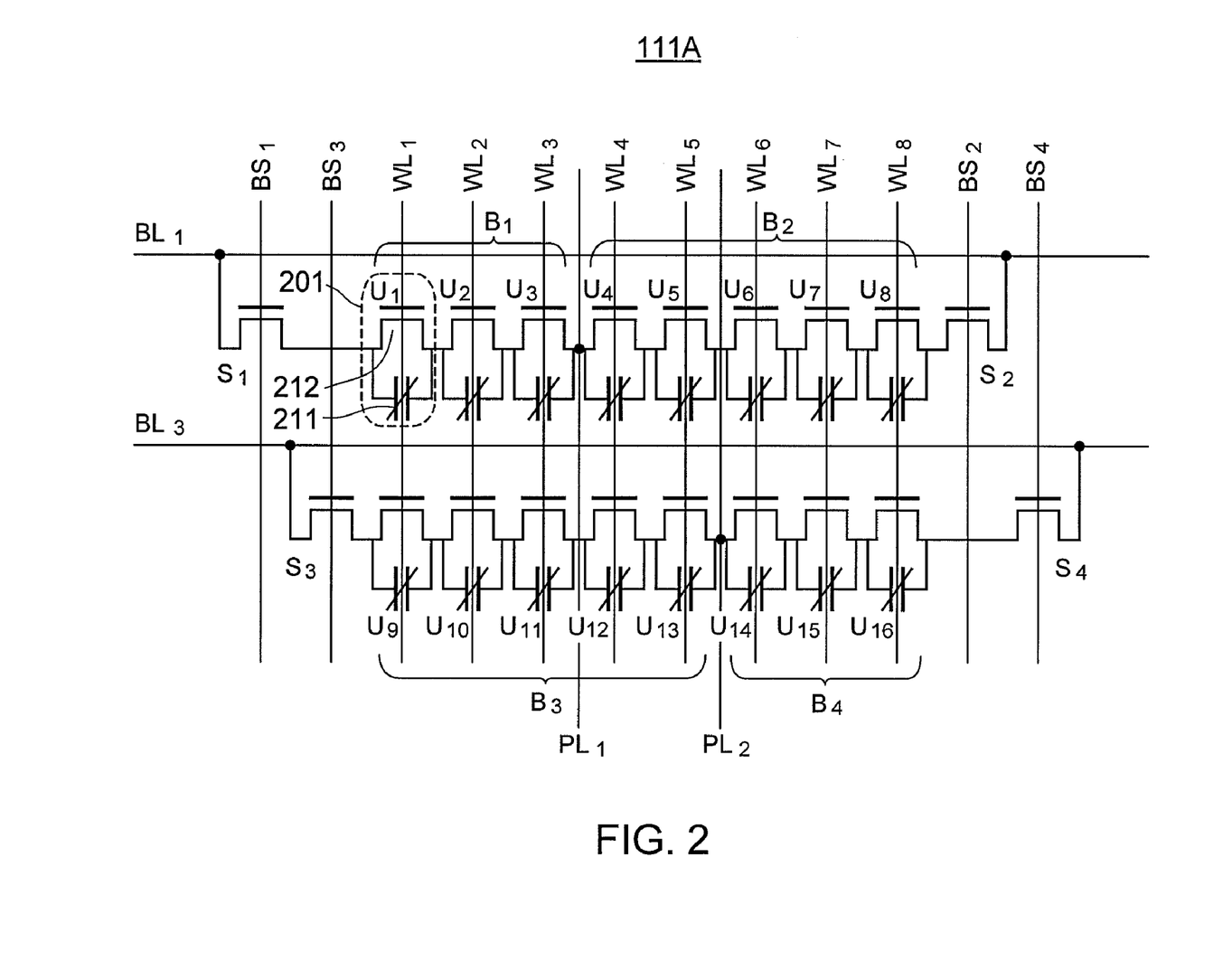
FIG. 2 is a circuit diagram showing a circuit configuration of a first memory cell array according to the first embodiment.

FIG. 2 shows a circuit configuration of the first memory cell array 111A shown in FIG. 1. As shown in FIG. 2, the first memory cell array 111A includes a plurality of units 201, in each of which a ferroelectric capacitor 211 and a transistor 212 are connected in parallel. As shown in FIG. 2, these units 201 are connected in series for each row. In this way, the ferroelectric memory 101 according to this embodiment is an FERAM of an RC-parallel-unit serial connection type, and each of the units 201 shown in FIG. 2 corresponds to an RC parallel unit.

Each unit 201 includes one ferroelectric capacitor 211 and one transistor 212. One electrode of the ferroelectric capacitor 211 is connected to a source of the transistor 212, and the other electrode of the ferroelectric capacitor 211 is connected to a drain of the transistor 212. A gate of the transistor 212 is connected to a word line WL.

FIG. 2 shows 16 units $U_1$ to $U_{16}$ as the units 201 that constitute the first memory cell array 111A. In FIG. 2, the eight units $U_1$ to $U_8$ are connected in series in order of numbers, and the eight units $U_9$ to $U_{16}$ are connected in series in order of numbers.

FIG. 2 also shows first to fourth blocks $B_1$ to $B_4$. The first to fourth blocks $B_1$ to $B_4$ include $N_1$ to $N_4$ (where $N_1$ to $N_4$ are positive integers) units 201, and are connected to first to fourth selection transistors $S_1$ to $S_4$, respectively.

FIG. 2 further shows the first and third bit lines $BL_1$ and $BL_3$, first to eighth word lines $WL_1$ to $WL_8$, and first and second plate lines $PL_1$ and $PL_2$ arranged in the first memory cell array 111A.

Both the first and second blocks $B_1$ and $B_2$ are connected to the first bit line $BL_1$. The first block $B_1$ includes the three units $U_1$ to $U_3$, and the second block $B_2$ includes the five units $U_4$ to $U_8$.

One end of the first block $B_1$ is connected to the first plate line $PL_1$, and the other end of the first block $B_1$ is connected to the first bit line $BL_1$ via the first selection transistor $S_1$. A gate of the first selection transistor $S_1$ is connected to a first block selection line $BS_1$. Further, one end of the second block $B_2$ is connected to the first plate line $PL_1$, and the other end of the second block $B_2$ is connected to the first bit line $BL_1$ via the second selection transistor $S_2$. A gate of the second selection transistor $S_2$ is connected to a second block selection line $BS_2$. In this way, the first and second blocks $B_1$ and $B_2$ are connected in common to the first plate line $PL_1$.

Moreover, both of the third and fourth blocks $B_3$ and $B_4$ are connected to the third bit line $BL_3$. The third block $B_3$ includes the five units $U_9$ to $U_{13}$, and the fourth block $B_4$ includes the three units $U_{14}$ to $U_{16}$.

One end of the third block $B_3$ is connected to the second plate line $PL_2$, and the other end of the third block $B_3$ is connected to the third bit line $BL_3$ via the third selection transistor $S_3$. A gate of the third selection transistor $S_3$ is connected to a third block selection line $BS_3$. Further, one end of the fourth block $B_4$ is connected to the second plate line $PL_2$, and the other end of the fourth block $B_4$ is connected to the third bit line $BL_3$ via the fourth selection transistor $S_4$. A gate of the fourth selection transistor $S_4$ is connected to a fourth block selection line $BS_4$. In this way, the third and fourth blocks $B_3$ and $B_4$ are connected in common to the second plate line $PL_2$.

The gates of the first to fourth selection transistors $S_1$ to $S_4$ are examples of control terminals according to the present invention, respectively. The first and second selection transistors $S_1$ and $S_2$ are connected to the units $U_1$ to $U_8$ in series. The third and fourth selection transistors $S_3$ and $S_4$ are connected to the units $U_9$ to $U_{16}$ in series.

As stated above, in FIG. 2, $N_1+N_2=N_3+N_4=8$ is satisfied, so that a total number of the units 201 in the first and second blocks $B_1$ and $B_2$, "$N_1+N_2$", is equal to a total number of the units 201 in the third and fourth blocks $B_3$ and $B_4$, "$N_3+N_4$". Furthermore, in FIG. 2, $N_1=3$, $N_2=5$, $N_3=5$, and $N_4=3$ are satisfied, so that the number of the units 201 in the first block $B_1$, "$N_1$", differs from the number of the units 201 in the third block $B_3$, "$N_3$", and the number of the units 201 in the second block $B_2$, "$N_2$" differs from the number of the units 201 in the fourth block $B_4$, "$N_4$". In this way, in FIG. 2, there are the blocks including different numbers of the units 201.

Moreover, the gates of the units $U_1$ to $U_8$ are connected to the first to eighth word lines $WL_1$ to $WL_8$, respectively. Likewise, the gates of the units $U_9$ to $U_{16}$ are connected to the first to eighth word lines $WL_1$ to $WL_8$, respectively. Accordingly, the first and third blocks $B_1$ and $B_3$ are connected in common to the first to third word lines $WL_1$ to $WL_3$, and the second and fourth blocks $B_2$ and $B_4$ are connected in common to the sixth to eighth word lines $WL_6$ to $WL_8$.

In this way, in FIG. 2, the first and third blocks $B_1$ and $B_3$ are connected in common to one or more word lines WLs, and the second and fourth blocks $B_2$ and $B_4$ are similarly connected in common to one or more word lines WLs.

An example of an operation performed by the first memory cell array 111A will now be described with reference to FIG. 2. In a standby state, the plate lines $PL_1$ and $PL_2$ are L, the word lines $WL_1$ to $WL_8$ are H, the bit lines $BL_1$ and $BL_3$ are L, and the block selection lines $BS_1$ to $BS_4$ are L. It is to be noted that H and L respectively represent "High" and "Low", which are voltages applied to the respective lines.

If one of the units $U_1$ to $U_3$ is to be accessed, then one of the word lines $WL_1$ to $WL_3$ becomes L, the block selection line $BS_1$ becomes H, and the plate line $PL_1$ is then driven. The plate line $PL_2$ is kept to have the same potential as that in the standby state.

If one of the units $U_4$ to $U_8$ is to be accessed, then one of the word lines $WL_4$ to $WL_8$ becomes L, the block selection line $BS_2$ becomes H, and the plate line $PL_1$ is then driven. The plate line $PL_2$ is kept to have the same potential as that in the standby state.

If one of the units $U_9$ to $U_{13}$ is to be accessed, then one of the word lines $WL_1$ to $WL_5$ becomes L, the block selection line $BS_3$ becomes H, and the plate line $PL_2$ is then driven. The plate line $PL_1$ is kept to have the same potential as that in the standby state.

If one of the units $U_{14}$ to $U_{16}$ is to be accessed, then one of the word lines $WL_6$ to $WL_8$ becomes L, the block selection line $BS_4$ becomes H, and the plate line $PL_2$ is then driven. The plate line $PL_1$ is kept to have the same potential as that in the standby state.

While the first memory cell array 111A has been described with reference to FIG. 2, the above-stated description relating to FIG. 2 similarly applies to the second memory cell array 111B shown in FIG. 1. The second memory cell array 111B is identical in circuit configuration to the first memory cell array 111A.

Figure 3:
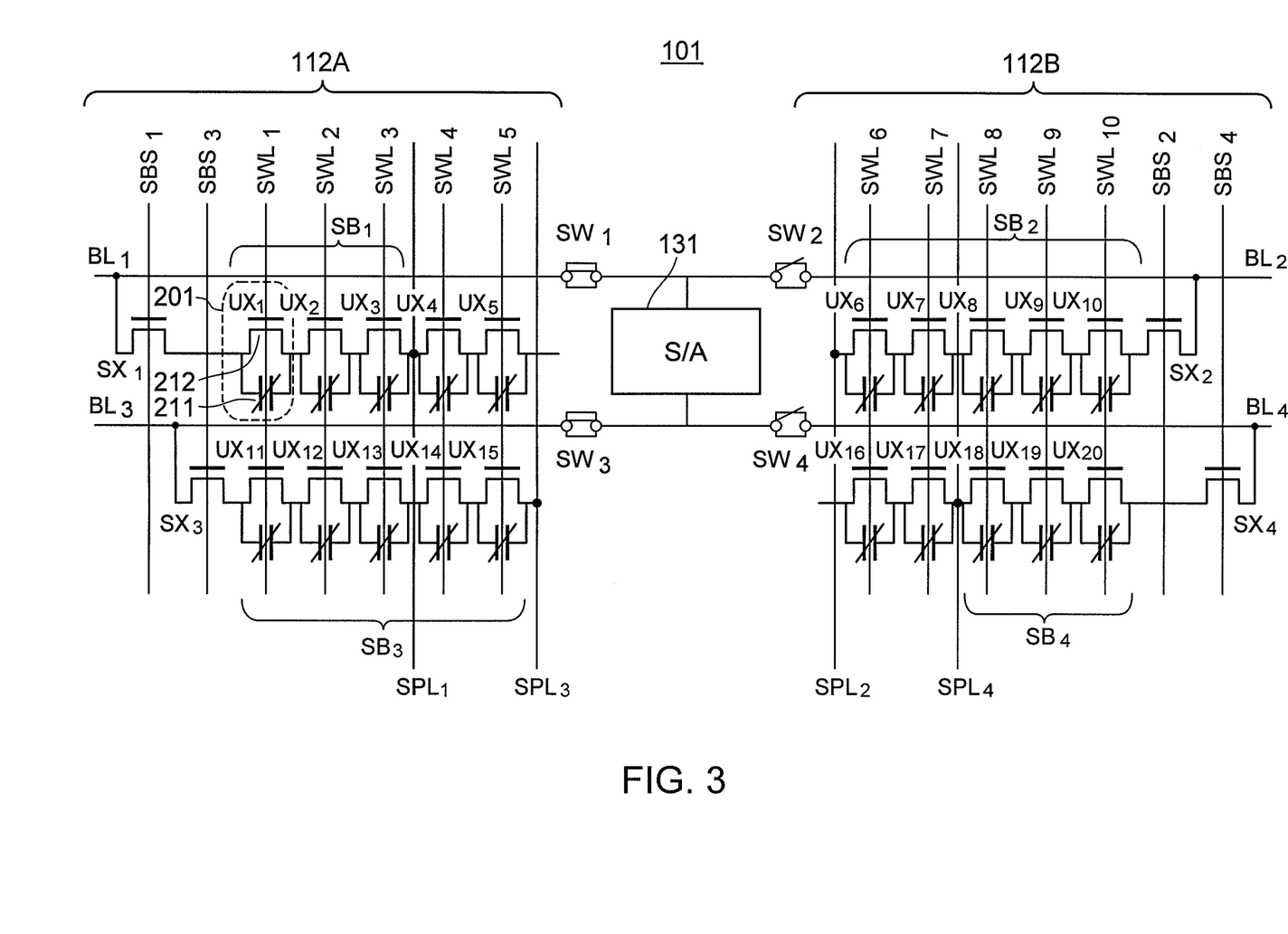
FIG. 3 is a circuit diagram showing a circuit configuration of first and second spare cell arrays according to the first embodiment.

FIG. 3 shows a circuit configuration of the first and second spare cell arrays 112A and 112B shown in FIG. 1. As shown in FIG. 3, each of the first and second spare cell arrays 112A and 112B includes a plurality of units 201, in each of which a ferroelectric capacitor 211 and a transistor 212 are connected in parallel. As shown in FIG. 3, these units 201 are connected in series for each row.

FIG. 3 shows ten units $UX_1$ to $UX_5$ and $UX_{11}$ to $UX_{15}$ as the units 201 that constitute the first spare cell array 112A. In FIG. 3, the five units $UX_1$ to $UX_5$ are connected in series in order of numbers, and the five units $UX_{11}$ to $UX_{15}$ are connected in series in order of numbers.

FIG. 3 also shows ten units $UX_6$ to $UX_{10}$ and $UX_{16}$ to $UX_{20}$ as the units 201 that constitute the second spare cell array 112B. In FIG. 3, the five units $UX_6$ to $UX_{10}$ are connected in series in order of numbers, and the five units $UX_{16}$ to $UX_{20}$ are connected in series in order of numbers.

FIG. 3 further shows first to fourth spare blocks $SB_1$ to $SB_4$. The first to fourth spare blocks $SB_1$ to $SB_4$ include $N_1$ to $N_4$ units 201 similarly to the first to fourth blocks $B_1$ to $B_4$, and are connected to first to fourth selection transistors $SX_1$ to $SX_4$ for redundancy repair, respectively. As described later, the first to fourth spare blocks $SB_1$ to $SB_4$ are used for redundancy repair of the first to fourth blocks $B_1$ to $B_4$, respectively. The first to fourth spare blocks $SB_1$ to $SB_4$ are examples of first to fourth redundant blocks of the present invention, respectively.

FIG. 3 further shows the first and third bit lines $BL_1$ and $BL_3$, first to fifth spare word lines $SWL_1$ to $SWL_5$, and first and third spare plate lines $SPL_1$ and $SPL_3$ arranged in the first spare cell array 112A.

FIG. 3 further shows the second and fourth bit lines $BL_2$ and $BL_4$, sixth to tenth spare word lines $SWL_6$ to $SWL_{10}$, and second and fourth spare plate lines $SPL_2$ and $SPL_4$ arranged in the second spare cell array 112B.

The first spare block $SB_1$ is located in the first spare cell array 112A, and includes the three units $UX_1$ to $UX_3$. One end of the first spare block $SB_1$ is connected to the first spare plate line $SPL_1$, and the other end of the first spare block $SB_1$ is connected to the first bit line $BL_1$ via the first selection transistor $SX_1$. A gate of the first selection transistor $SX_1$ is connected to a first spare block selection line $SBS_1$.

Further, the second spare block $SB_2$ is located in the second spare cell array 112B, and includes the five units $UX_6$ to $UX_{10}$. One end of the second spare block $SB_2$ is connected to the second spare plate line $SPL_2$, and the other end of the second spare block $SB_2$ is connected to the second bit line $BL_2$ via the second selection transistor $SX_2$. A gate of the second selection transistor $SX_2$ is connected to a second spare block selection line $SBS_2$.

Further, the third spare block $SB_3$ is located in the first spare cell array 112A, and includes the five units $UX_{11}$ to $UX_{15}$. One end of the third spare block $SB_3$ is connected to the third spare plate line $SPL_3$, and the other end of the third spare block $SB_3$ is connected to the third bit line $BL_2$ via the third selection transistor $SX_3$. A gate of the third selection transistor $SX_3$ is connected to a third spare block selection line $SBS_3$.

Further, the fourth spare block $SB_4$ is located in the second spare cell array 112B, and includes the three units $UX_{18}$ to $UX_{20}$. One end of the fourth spare block $SB_4$ is connected to the fourth spare plate line $SPL_4$, and the other end of the fourth spare block $SB_4$ is connected to the fourth bit line $BL_4$ via the fourth selection transistor $SX_4$. A gate of the fourth selection transistor $SX_4$ is connected to a fourth spare block selection line $SBS_4$.

The first to fourth selection transistors $SX_1$ to $SX_4$ are examples of first to fourth redundant block selection transistors of the present invention, respectively. The gates of the first to fourth selection transistors $SX_1$ to $SX_4$ are examples of control terminals of the present invention, respectively. The first to fourth selection transistors $SX_1$ to $SX_4$ are connected to the units $UX_1$ to $UX_5$, the units $UX_6$ to $UX_{10}$, the units $UX_{11}$ to $UX_{15}$, and the units $UX_{16}$ to $UX_{20}$ in series, respectively.

As stated above, the first to fourth spare blocks $SB_1$ to $SB_4$ include the three, five, five, and three units 201, respectively, which are identical to the numbers of the units 201 in the first to fourth blocks $B_1$ to $B_4$, respectively. Thereby, the first to fourth spare blocks $SB_1$ to $SB_4$ can be used for redundancy repair of the first to fourth blocks $B_1$ to $B_4$, respectively. The first to fourth spare blocks $SB_1$ to $SB_4$ may include more than three, five, five, and three units 201, i.e., more than $N_1$ to $N_4$ units 201, respectively.

In FIG. 3, the units $UX_4$ and $UX_5$ are provided in the same row as that of the first spare block $SB_1$, and the units $UX_{16}$ and $UX_{17}$ are provided in the same row as that of the fourth spare block $SB_4$. These units 201 are dummy cells (dummy units). In this embodiment, the numbers of the units 201 in respective rows of the first and second spare cell arrays 112A and 112B are made uniform to five by providing such dummy cells. This can improve symmetry of the spare cell arrays 112A and 112B. In FIG. 3, $N_3-N_1$ dummy cells are connected to the first spare block $SB_1$ and $N_2-N_4$ dummy cells are connected to the fourth spare block $SB_4$ according to settings of $N_1<N_3$ and $N_2>N_4$. Conversely, if "$N_1>N_3$", $N_1-N_3$ dummy cells are connected to the third spare block $SB_3$. If "$N_2<N_4$", $N_4-N_2$ dummy cells are connected to the second spare block $SB_2$. In this embodiment, no dummy cells may be provided.

FIG. 3 further shows the sense amplifier 131 shown in FIG. 1. As shown in FIG. 3, the sense amplifier 131 is connected to the first to fourth bit lines $BL_1$ to $BL_4$ via first to fourth switches $SW_1$ to $SW_4$, respectively. The sense amplifier 131 is thereby selectively connectable to one of the first and second bit lines $BL_1$ and $BL_2$, and selectively connectable to one of the third and fourth bit lines $BL_3$ and $BL_4$.

This enables the first and second spare cell arrays 112A and 112B to be used for redundancy repair of the first memory cell array 111A. In this embodiment, the first to fourth spare blocks $SB_1$ to $SB_4$ are used for redundancy repair of the first to fourth blocks $B_1$ to $B_4$, respectively. That is, the first spare cell array 112A is used for the redundancy repair of the first and third blocks $B_1$ and $B_3$, and the second spare cell array 112B is used for the redundancy repair of the second and fourth blocks $B_2$ and $B_4$. The first and second spare cell arrays 112A and 112B are also used for redundancy repair of the second memory cell array 111B. That is, in this embodiment, the first and second spare cell arrays 112A and 112B are shared between the first and second memory cell arrays 111A and 111B.

As stated above, in this embodiment, the blocks each including the five units 201, and the blocks each including the three units 201 are mixed together in one memory cell array. Nevertheless, in this embodiment, since the first to fourth spare blocks $SB_1$ to $SB_4$ are respectively used for redundancy repair of the first to fourth blocks $B_1$ to $B_4$, the number of the units 201 per row of each spare cell array is such a small number as five at maximum. In this way, according to this embodiment, even if redundancy repair of a ferroelectric memory in which the blocks different in the number of the units are mixed together is to be dealt with, redundancy repair efficiency can be maintained and yield of LSI can be thereby improved.

Furthermore, the gates of the units $UX_1$ to $UX_{10}$ are connected to the first to tenth spare word lines $SWL_1$ to $SWL_{10}$, respectively. Likewise, the gates of the units $UX_{11}$ to $UX_{20}$ are connected to the first to tenth spare word lines $SWL_1$ to $SWL_{10}$, respectively. Accordingly, the first and third spare blocks $SB_1$ and $SB_3$ are connected in common to the first to third spare word lines $SWL_1$ to $SWL_3$, and the second and fourth spare blocks $SB_2$ and $SB_4$ are connected in common to the eighth to tenth spare word lines $SWL_8$ to $SWL_{10}$.

In this way, in FIG. 3, the first and third spare blocks $SB_1$ and $SB_3$ are connected in common to one or more spare word lines SWLs, and the second and fourth spare blocks $SB_2$ and $SB_4$ are similarly connected in common to one or more spare word lines SWLs.

Redundancy repair of the ferroelectric memory 101 according to this embodiment will be described with reference to FIGS. 2 and 3. In the following description, reference is made to FIG. 2 for components of the first memory cell array 111A, and to FIG. 3 for components of the first and second spare cell arrays 112A and 112B.

In a standby state, the plate lines $PL_1$ and $PL_2$ are L, the word lines $WL_1$ to $WL_6$ are H, the bit lines $BL_1$ to $BL_4$ are L, and the block selection lines $BS_1$ to $BS_4$ are L. Further, the spare plate lines $SPL_1$ to $SPL_4$ are L, the spare word lines $SWL_1$ to $SWL_{10}$ are H, and the spare block selection lines $SBS_1$ to $SBS_4$ are L. It is to be noted that H and L respectively represent "High" and "Low", which are voltages applied to the respective lines.

In this embodiment, if a defect occurs to the first word line $WL_1$, the first word line $WL_1$ is replaced by the first spare word line $SWL_1$. More specifically, if an address signal for selecting the first word line $WL_1$ is inputted, then the first spare word line $SWL_1$ becomes L instead of the first word line $WL_1$, the first or third spare plate line $SPL_1$ or $SPL_3$ is activated instead of the first or second plate line $PL_1$ or $PL_2$, the first or third spare block selection line $SBS_1$ or $SBS_3$ is activated instead of the first or third block selection line $BS_1$ or $BS_3$, and the first and third bit lines $BL_1$ and $BL_3$ are connected to the sense amplifier 131. Thereby, the unit $U_1$ or $U_9$ is replaced by the unit $U_{x1}$ or $UX_{11}$.

Likewise, if a defect occurs to the second or third word line $WL_2$ or $WL_3$, the second or third word line $WL_2$ or $WL_3$ is replaced by the second or third spare word line $SWL_2$ or $SWL_3$. More specifically, if an address signal for selecting the second or third word line $WL_2$ or $WL_3$ is inputted, then the second or third spare word line $SWL_2$ or $SWL_3$ becomes L instead of the second or third word line $WL_2$ or $WL_3$, the first or third spare plate line $SPL_1$ or $SPL_3$ is activated instead of the first or second plate line $PL_1$ or $PL_2$, the first or third spare block selection line $SBS_1$ or $SBS_3$ is activated instead of the first or third block selection line $BS_1$ or $BS_3$, and the first and third bit lines $BL_1$ and $BL_3$ are connected to the sense amplifier 131. Thereby, the unit $U_2$, $U_3$, $U_{10}$, or $U_{11}$ is replaced by the unit $UX_2$, $UX_3$, $UX_{12}$, or $UX_{13}$.

If a defect occurs to the fourth or fifth word line $WL_4$ or $WL_5$, a spare word line SWL to be selected differs according to a plate line PL to be activated.

If a unit to be accessed (referred to as "an access target unit", hereinafter) is the unit $U_4$ or $U_5$, the first plate line $PL_1$ becomes a plate line to be activated (referred to as "an activation target plate line", hereinafter). In this case, the fourth or fifth word line $WL_4$ or $WL_5$ is replaced by the sixth or seventh spare word line $SWL_6$ or $SWL_7$. More specifically, if the fourth or fifth word line $WL_4$ or $WL_5$ is a word line to be selected (referred to as "a selection target word line", hereinafter) and the plate line $PL_1$ is an activation target plate line, then the sixth or seventh spare word line $SWL_6$ or $SWL_7$ becomes L instead of the fourth or fifth word line $WL_4$ or $WL_5$, the second spare plate line $SPL_2$ is activated instead of the first plate line $PL_1$, the second spare block selection line $SBS_2$ is activated instead of the second block selection line $BS_2$, and the second and fourth bit lines $BL_2$ and $BL_4$ are connected to the sense amplifier 131. Thereby, the unit $U_4$ or $U_5$ is replaced by the unit $UX_6$ or $UX_7$.

If an access target unit is the unit $U_{12}$ or $U_{13}$, the second plate line $PL_2$ becomes an activation target plate line. In this case, the fourth or fifth word line $WL_4$ or $WL_5$ is replaced by the fourth or fifth spare word line $SWL_4$ or $SWL_5$. More specifically, if the fourth or fifth word line $WL_4$ or $WL_5$ is a selection target and the second plate line $PL_2$ is an activation target, then the fourth or fifth spare word line $SWL_4$ or $SWL_5$ becomes L instead of the fourth or fifth word line $WL_4$ or $WL_5$, the third spare plate line $SPL_3$ is activated instead of the second plate line $PL_2$, the third spare block selection line $SBS_3$ is activated instead of the third block selection line $BS_3$, and the first and third bit lines $BL_1$ and $BL_3$ are connected to the sense amplifier 131. Thereby, the unit $U_{12}$ or $U_{13}$ is replaced by the unit $UX_{14}$ or $UX_{15}$.

If a defect occurs to the sixth, seventh, or eighth word line $WL_6$, $WL_7$, or $WL_8$, the sixth, seventh, or eighth word line $WL_6$, $WL_7$, or $WL_8$ are replaced by the eighth, ninth, or tenth spare word lines $SWL_8$, $SWL_9$, or $SWL_{10}$. More specifically, if an address signal for selecting the sixth, seventh, or eighth word line $WL_6$, $WL_7$, or $WL_8$ is inputted then the eighth, ninth, or tenth spare word line $SWL_8$, $SWL_9$, or $SWL_{10}$ becomes L instead of the sixth, seventh, or eighth word line $WL_6$, $WL_7$, or $WL_8$, the second or fourth spare plate line $SPL_2$ or $SPL_4$ is activated instead of the first or second plate line $PL_1$ or $PL_2$, the second or fourth spare block selection line $SBS_2$ or $SBS_4$ is activated instead of the second or fourth block selection line $BS_2$ or $BS_4$, and the second and fourth bit lines $BL_2$ and $BL_4$ are connected to the sense amplifier 131. Thereby, the units $U_6$ to $U_8$ or $U_{14}$ to $U_{16}$ are replaced by the units $UX_{11}$ to $UX_{15}$ or $U_{18}$ to $U_{20}$.

If a defect occurs to the first or second plate line $PL_1$ or $PL_2$, the first to seventh word lines $WL_1$ to $WL_7$ are replaced by the first to tenth spare word lines $SWL_1$ to $SWL_{10}$ as stated above. If a defect occurs to the first block selection line $BS_1$, the first to third word lines $WL_1$ to $WL_3$ are replaced by the first to third spare word lines $SWL_1$ to $SWL_3$ as stated above. If a defect occurs to the second block selection line $BS_2$, the fourth to eighth word lines $WL_4$ to $WL_8$ are replaced by the sixth to tenth spare word lines $SWL_6$ to $SWL_{10}$ as stated above. If a defect occurs to the third block selection line $BS_3$, the first to fifth word lines $WL_1$ to $WL_5$ are replaced by the first to fifth spare word lines $SWL_1$ to $SWL_5$ as stated above. If a defect occurs to the fourth block selection line $BS_4$, the sixth to eighth word lines $WL_6$ to $WL_8$ are replaced by the eighth to tenth spare word lines $SWL_8$ to $SWL_{10}$ as stated above.

Figure 4:
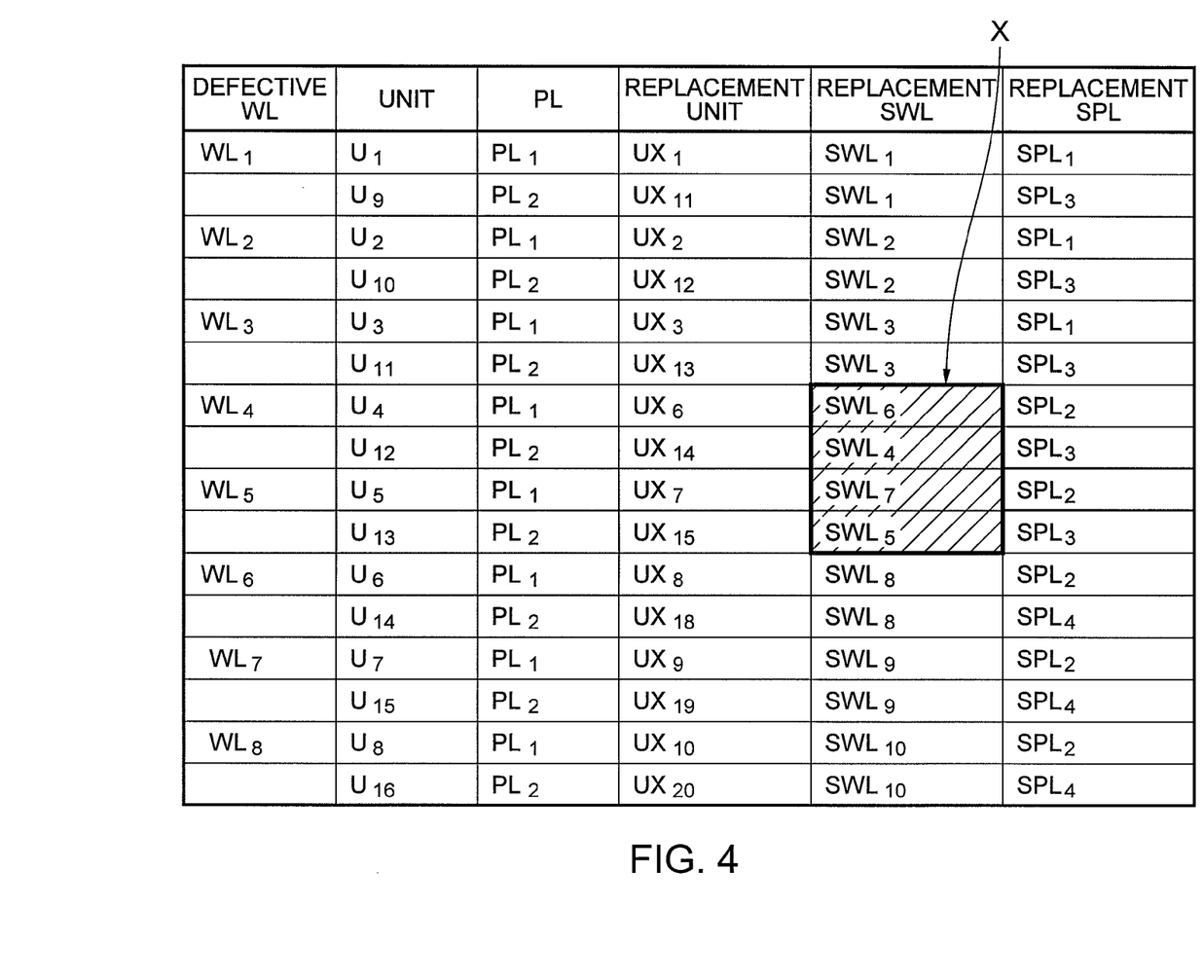
FIG. 4 shows a table showing redundancy repair rules according to the first embodiment.

In this embodiment, the redundancy repair of the ferroelectric memory 101 is conducted according to the above-stated replacement rules. The table of FIG. 4 shows the replacement rules. For example, if a defective word line is $WL_1$, the access target unit is $U_1$, and the activation target plate line is $PL_1$, then the replacement unit 201 is $UX_1$, the replacement spare word line is $SWL_1$, and the replacement spare plate line is $SPL_1$. If the defective word line is $WL_4$ or $WL_5$, the replacement spare word line is different according to the activation target plate line.

In this embodiment, the word lines $WL_1$ and $WL_2$ are replaced by the spare word lines $SWL_1$ and $SWL_2$, respectively. Alternatively, the word lines $WL_1$ and $WL_2$ may be replaced by the spare word lines $SWL_2$ and $SWL_1$, respectively. In this way, in this embodiment, combinations of word lines and spare word lines can be arbitrarily set.

In this embodiment, for example, the two spare word lines $SWL_4$ and $SWL_6$ may be integrated into one spare word line. Likewise, the two spare word lines $SWL_5$ and $SWL_7$ may be integrated into one spare word line. In this way, in this embodiment, when one spare word line and another spare word line are both connected to dummy cells and connected to different spare blocks, these spare word lines can be integrated into one spare word line.

Furthermore, in this embodiment, if a defect is present on a word line, $2^k$ word lines including this defective word line may be collectively replaced by $2^k$ spare word lines, where k is a positive integer. For example, if a defect is present on one of the word lines $WL_1$ and $WL_2$, the word lines $WL_1$ and $WL_2$ may be collectively replaced by the spare word lines $SWL_1$ and $SWL_2$. Alternately, if a defect is present on one of the word lines $WL_1$ to $WL_4$, the word lines $WL_1$ to $WL_4$ may be collectively replaced by the spare word lines $SWL_1$ to $SWL_4$.

Such a $2^k$-to-$2^k$ replacement has an advantage in that it is possible to simplify a comparison processing performed by the address comparator 122 (FIG. 1). This advantage will be described while taking a 4-to-4 replacement from the word lines $WL_1$ to $WL_4$ to the spare word lines $SWL_1$ to $SWL_4$ as an example.

In this example, it is assumed that the addresses of the word lines $WL_1$ to $WL_4$ are "**00", "01", "10", and "11", respectively, and each address signal is an N-bit signal (where N is a positive integer). Each of "00", "01", "10", and "11" represents two low order bits from the lowest order bit of the address signal, and "**" represents N−2 high order bits from the highest order bit of the address signal. Therefore, the N−2 high order bits are common to address signals of the word lines $WL_1$ to $WL_4$. In this way, the address of each word line is represented by N-bit data in this embodiment.

In the comparison processing, the address comparator 122 compares an address signal with a defective address signal. In this example, it is assumed that a defect is present on one of the word lines $WL_1$ to $WL_4$. Therefore, in this example, as long as the address signal is one of "**00", "01", "10", and "11", the word lines $WL_1$ and $WL_4$ are replaced by the spare word lines $SWL_1$ to $SWL_4$. In other words, as long as the N−2 high order bits of the address signal are "**", the word lines $WL_1$ to $WL_4$ are replaced by the spare word lines $SWL_1$ to $SWL_4$.

It is understood from the above that there is no need to compare the N-bit address signal with the N-bit defective address signal but it is sufficient to compare the N−2 high order bits of the address signal with the N−2 high order bits of the defective address signal in the comparison processing. Therefore, in this example, it is possible to adopt an (N−2)-bit comparison processing instead of the N-bit comparison processing. If the (N−2)-bit comparison processing is adopted, the comparison processing can be performed more easily than the N-bit comparison processing. Moreover, the defective address signal stored in the nonvolatile memory 121 (FIG. 1) may be a (N−2)-bit signal instead of the N-bit signal. This can realize memory saving.

In this way, when the four-to-four replacement is adopted, the comparison processing can be made simpler by dealing with four word lines whose addresses are common with respect to two low order bits, as a group of word lines. Moreover, when the $2^k$-to-$2^k$ replacement is adopted, the comparison processing can be made simpler by dealing with $2^k$ word lines whose addresses are common with respect to k low order bits, as a group of word lines.

As stated above, in this embodiment, $N_1+N_2=N_3+N_4=8$ is satisfied, so that the total number of the units 201 in the first and second blocks $B_1$ and $B_2$, "$N_1+N_2$", is equal to the total number of the units 201 in the third and fourth blocks $B_3$ and $B_4$, "$N_3+N_4$". Alternatively, the value of $N_1+N_2$ and $N_3+N_4$ may be other than 8.

In this embodiment, for example, the value of $N_1+N_2$ and $N_3+N_4$ may be the n-th power of 2 (where n is a positive integer). That is, $N_1+N_2$ and $N_3+N_4$ may be $2^n$ ($N_1+N_2=N_3+N_4=2^n$). If $N_1+N_2=N_3+N_4=2^n$ is satisfied and the $2^k$-to-$2^k$ replacement is adopted, it is advantageously possible to classify the word lines for the first to fourth blocks $B_1$ to $B_4$ into word line groups with nothing left over, for example.

In this embodiment, $N_1=3$, $N_2=5$, $N_3=5$, and $N_4=3$ are satisfied, and a difference in the number of the units 201 between the first block $B_1$ and second block $B_2$, $|N_1-N_2|$, is equal to a difference in the number of the units 201 between the third block $B_3$ and fourth block $B_4$, $|N_3-N_4|$. However, the value of $|N_1-N_2|$ may differ from the value of $|N_3-N_4|$. An example of such a case is shown in a fourth embodiment to be described later (where $|N_1-N_2|\neq|N_5-N_6|$ and the like are satisfied).

As stated above, in this embodiment, the first to fourth spare blocks $SB_1$ to $SB_4$ are used for redundancy repair of the first to fourth blocks $B_1$ to $B_4$, respectively. According to this embodiment, it is thereby possible to maintain redundancy repair efficiency even if redundancy repair of the ferroelectric memory in which blocks having different numbers of the units are mixed together is to be dealt with.

Ferroelectric memories 101 according to second to fourth embodiments will be described below. These embodiments are modifications of the first embodiment, and will be described mainly as to points different from those of the first embodiment.

Second Embodiment

Figure 5:
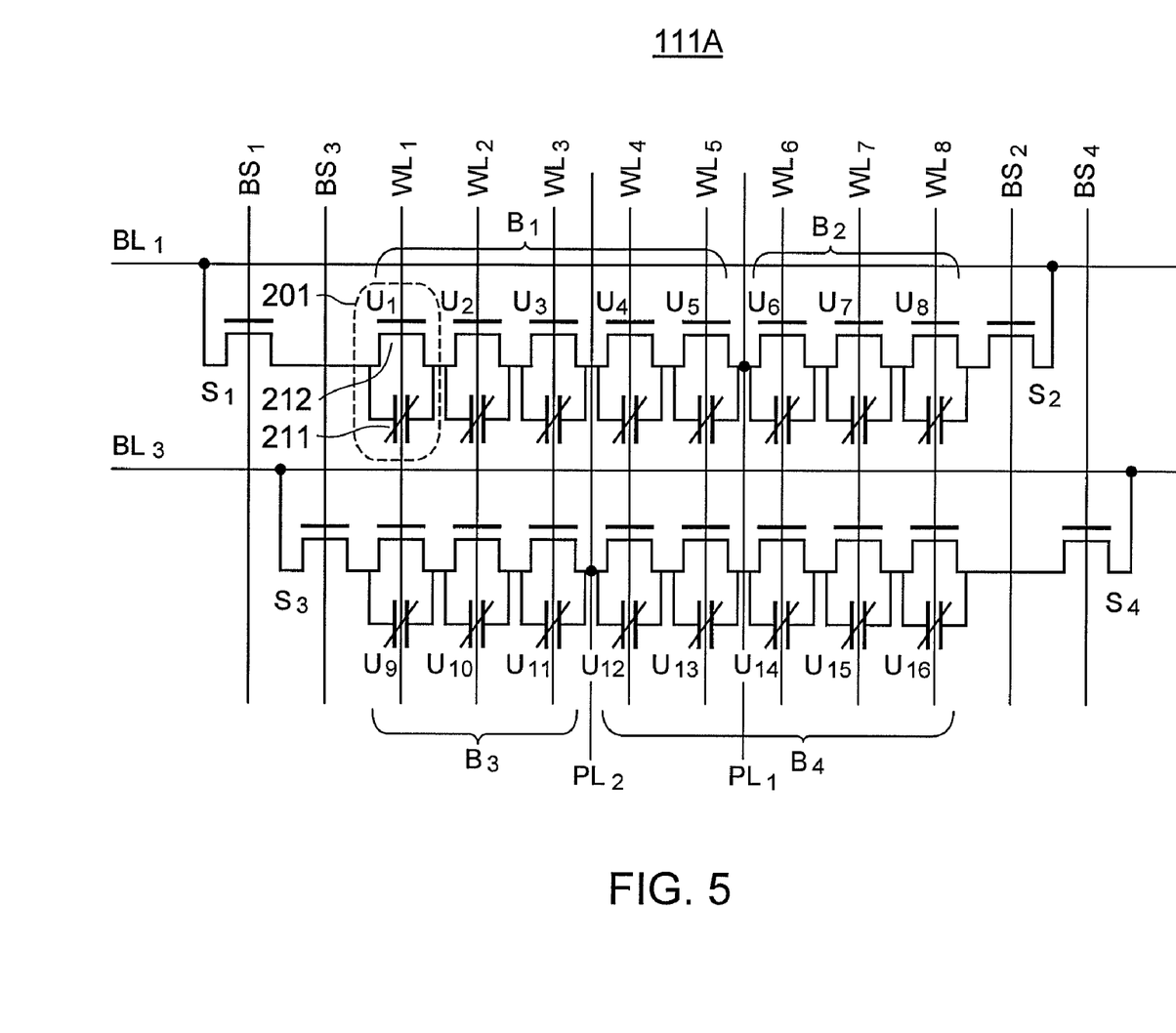
FIG. 5 is a circuit diagram showing a circuit configuration of a first memory cell array according to a second embodiment.

FIG. 5 shows a circuit configuration of a first memory cell array 111A according to a second embodiment. The circuit configuration shown in FIG. 5 is a modification of that shown in FIG. 2. It is to be noted that the circuit diagram of FIG. 1 is common to the first and second embodiments.

In FIG. 5, first to fourth blocks $B_1$ to $B_4$ include five, three, three, and five units 201, respectively. Accordingly, a first plate line $PL_1$ is located between a fifth word line $WL_5$ and a sixth word line $WL_6$, and a second plate line $PL_2$ is located between a third word line $WL_3$ and a fourth word line $WL_4$.

In this way, the number of the units 201 in each block and arrangement of the plate lines are not limited to those of the first embodiment, and the number of the units 201 and the arrangement of the plate lines such as those of the second embodiment can be also adopted, for example.

Figure 6:
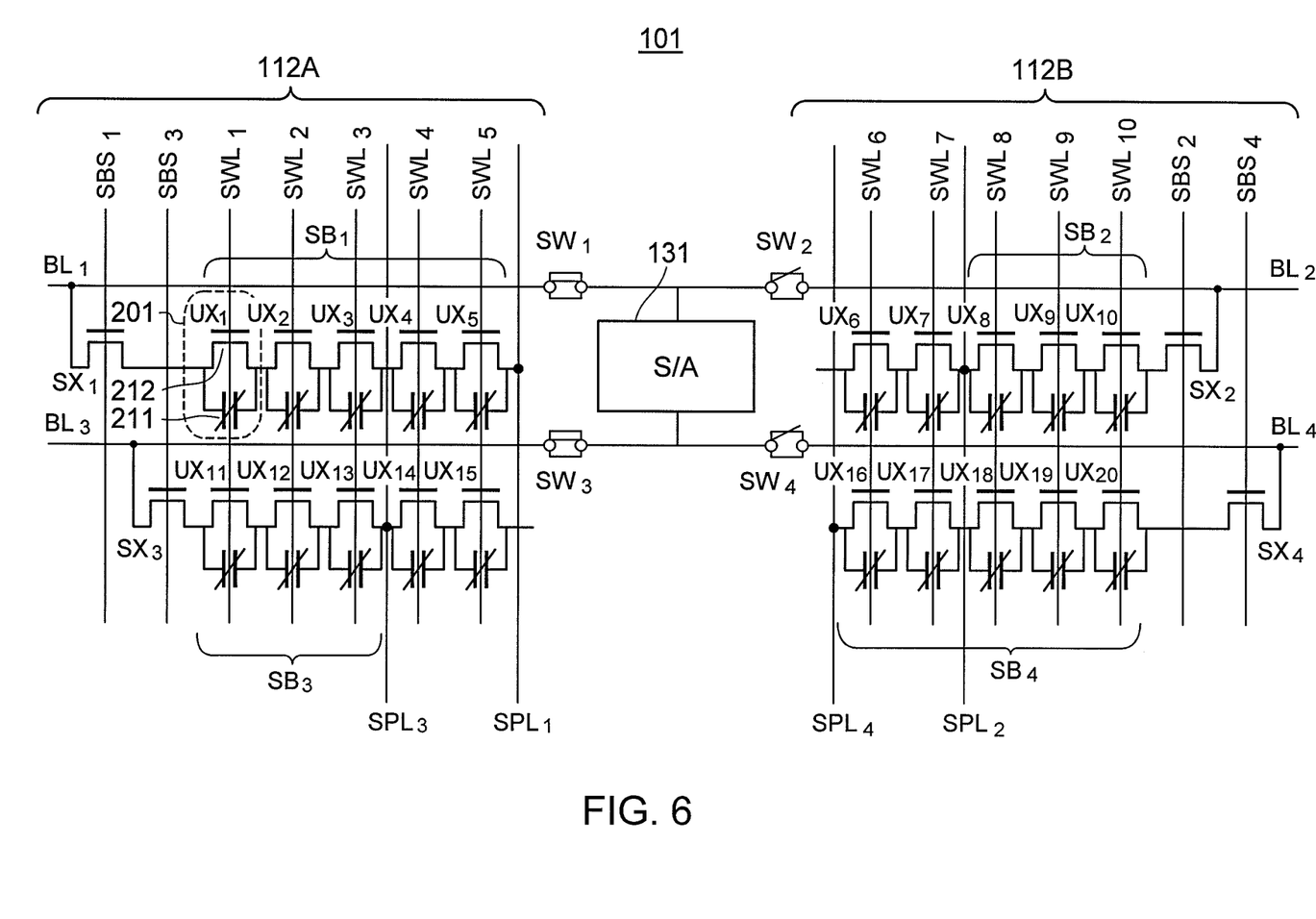
FIG. 6 is a circuit diagram showing a circuit configuration of first and second spare cell arrays according to the second embodiment.

FIG. 6 shows a circuit configuration of first and second spare cell arrays 112A and 112B according to the second embodiment. The circuit configuration shown in FIG. 6 is a modification of that shown in FIG. 3.

In FIG. 6, first to fourth spare blocks $SB_1$ to $SB_4$ respectively include five, three, three, and five units 201, corresponding to the circuit configuration shown in FIG. 5. In FIG. 6, units $UX_6$, $UX_7$, $UX_{14}$, and $UX_{15}$ are dummy cells.

Further, in FIG. 6, a first spare plate line $SPL_1$ is located on the right of a fifth spare word line $SWL_5$, and a second spare plate line $SPL_2$ is located between a seventh spare word line $SWL_7$ and an eighth spare word line $SWL_8$, corresponding to the circuit configuration shown in FIG. 5.

Furthermore, in FIG. 6, a third spare plate line $SPL_3$ is located between a third spare word line $SWL_3$ and a fourth spare word line $SWL_4$, and a fourth spare plate line $SPL_4$ is located on the left of a sixth spare word line $SWL_6$, corresponding to the circuit configuration shown in FIG. 5.

Figure 7:
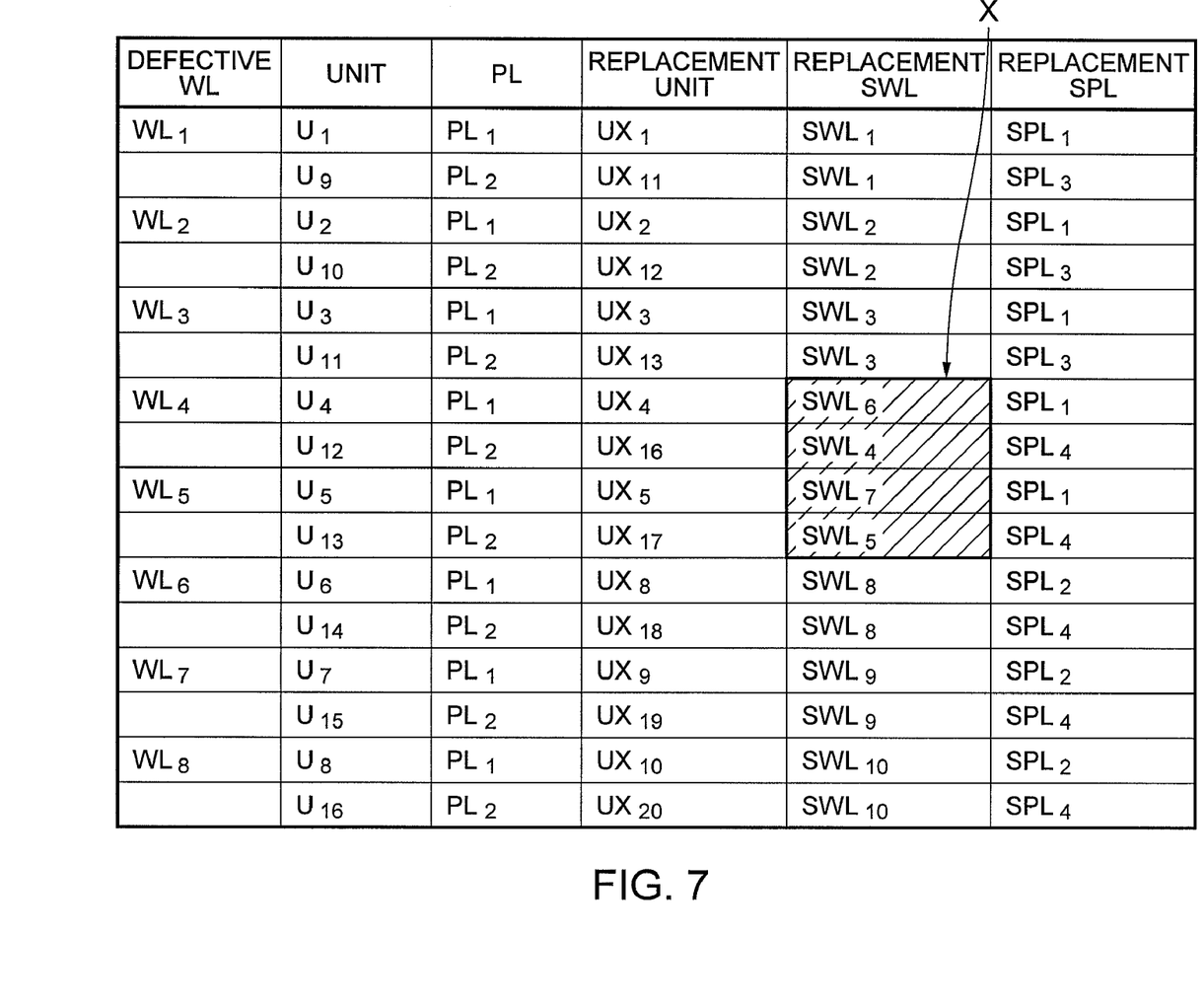
FIG. 7 shows a table showing redundancy repair rules according to the second embodiment.

A method for redundancy repair according to the second embodiment is similar to that according to the first embodiment. The table of FIG. 7 shows redundancy repair rules according to the second embodiment. As can be understood from comparison of the table of FIG. 4 with that of FIG. 7, replacement units and replacement spare plate lines to be used are different between FIG. 4 and FIG. 7 in case where a defective word line is $WL_4$ or $WL_5$.

As stated above, in this embodiment, the blocks each including the five units 201, and the blocks each including the three units 201 are mixed together in one memory cell array, similarly to the first embodiment. Nevertheless, in this embodiment, since the first to fourth spare blocks $SB_1$ to $SB_4$ are respectively used for redundancy repair of the first to fourth blocks $B_1$ to $B_4$, the number of the units 201 per row of each spare cell array is such a small number as five at maximum, similarly to the first embodiment. In this way, according to this embodiment, even if redundancy repair of a ferroelectric memory in which the blocks different in the number of the units are mixed together is to be dealt with, redundancy repair efficiency can be maintained and yield of LSI can be thereby improved, similarly to the first embodiment.

Alternatively, in this embodiment, the circuit configuration shown in FIG. 2 can be adopted as that of the first memory cell array 111A shown in FIG. 1, and the circuit configuration shown in FIG. 6 can be adopted as that of the first and second spare memory cell arrays 112A and 112B shown in FIG. 1. In other words, the configuration according to the first embodiment may be adopted for memory cells, and the configuration according to the second embodiment may be adopted for spare cells. In this case, the redundancy repair rules shown in FIG. 4 can be adopted as redundancy repair rules of this case.

Further, in this embodiment, the circuit configuration shown in FIG. 5 can be adopted as that of the first memory cell array 111A shown in FIG. 1, and the circuit configuration shown in FIG. 3 can be adopted as that of the first and second spare memory cell arrays 112A and 112B shown in FIG. 1. In other words, the configuration according to the second embodiment may be adopted for memory cells, and the configuration according to the first embodiment may be adopted for spare cells. In this case, the redundancy repair rules shown in FIG. 7 can be adopted as redundancy repair rules of this case.

Third Embodiment

Figure 8:
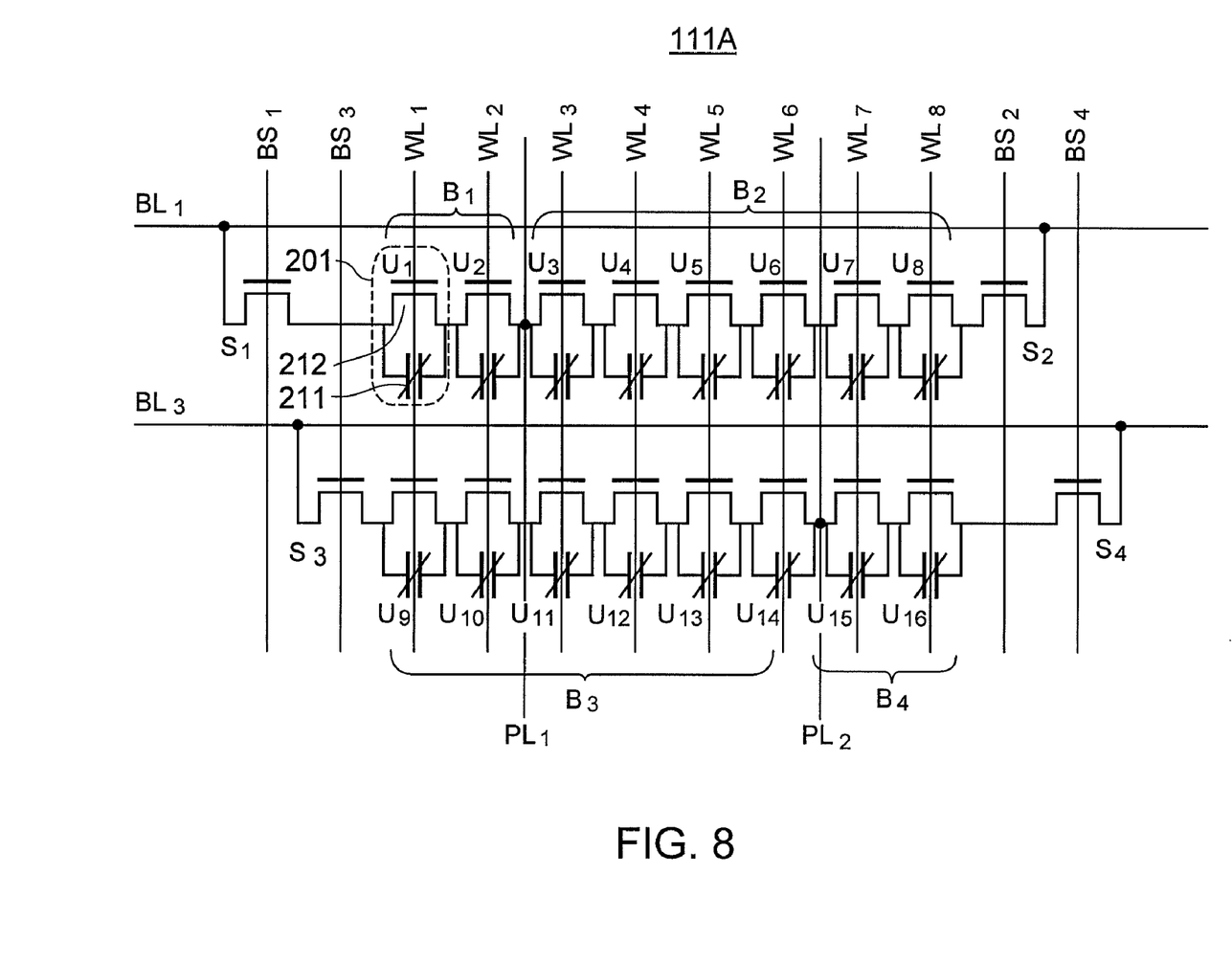
FIG. 8 is a circuit diagram showing a circuit configuration of a first memory cell array according to a third embodiment.

FIG. 8 shows a circuit configuration of a first memory cell array 111A according to a third embodiment. The circuit configuration shown in FIG. 8 is a modification of that shown in FIG. 2. It is to be noted that the circuit diagram of FIG. 1 is common to the first and third embodiments.

In FIG. 8, first to fourth blocks $B_1$ to $B_4$ include two, six, six, and two units 201, respectively. Accordingly, a first plate line $PL_1$ is located between a second word line $WL_2$ and a third word line $WL_3$, and a second plate line $PL_2$ is located between a sixth word line $WL_6$ and a seventh word line $WL_7$.

As shown in FIG. 8, in the third embodiment, the blocks each including six units 201, and the blocks each including two units 201 are mixed together in the first memory cell array 111A. In this way, a combination of the blocks mixed in one memory cell array is not limited to that of the first embodiment, and a combination of the blocks such as that of the third embodiment can be also adopted, for example.

Figure 9:
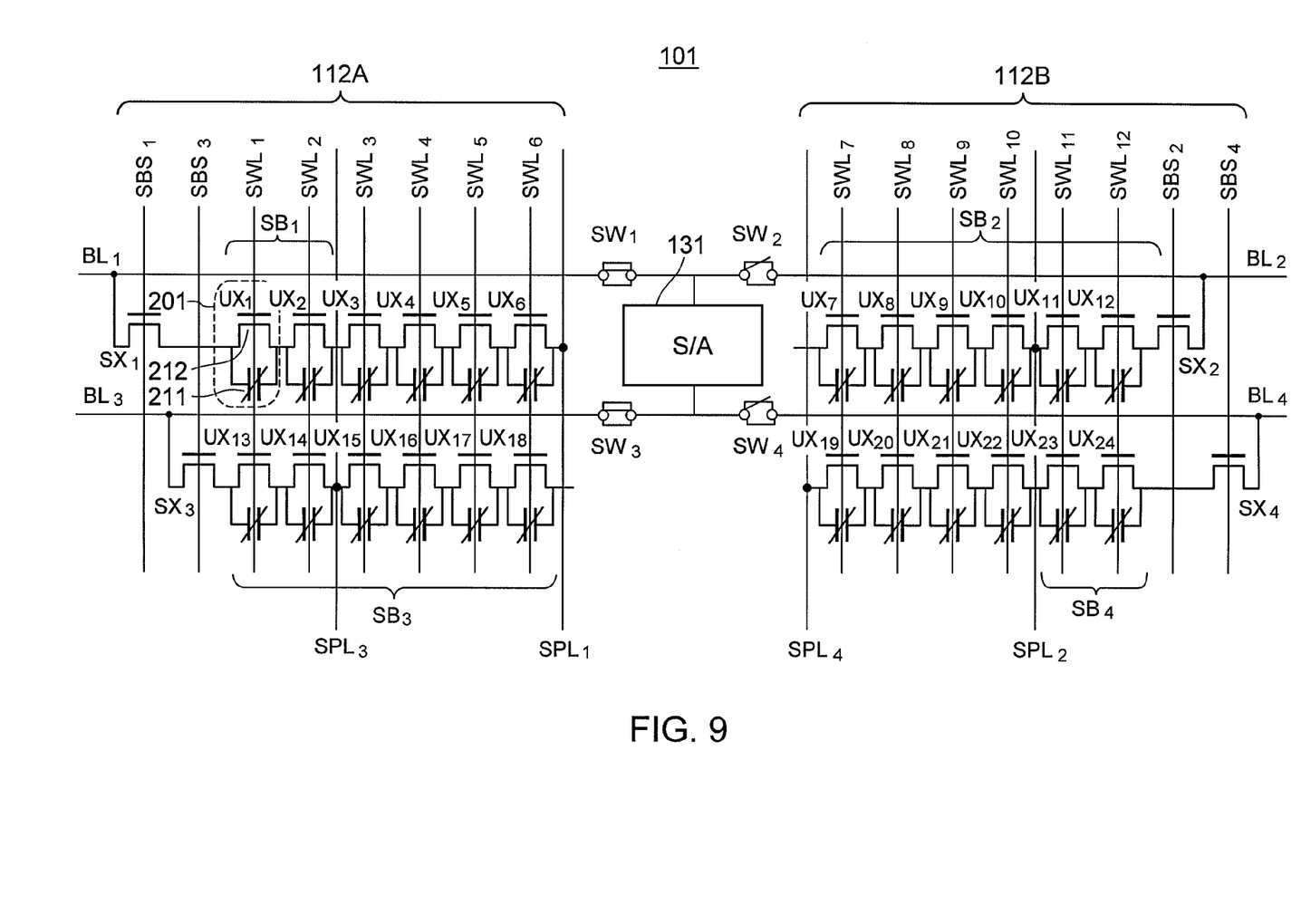
FIG. 9 is a circuit diagram showing a circuit configuration of first and second spare cell arrays according to the third embodiment.

FIG. 9 shows a circuit configuration of first and second spare cell arrays 112A and 112B according to the third embodiment. The circuit configuration shown in FIG. 9 is a modification of that shown in FIG. 3.

In FIG. 9, first to fourth spare blocks $SB_1$ to $SB_4$ respectively include two, six, six, and two units 201, corresponding to the circuit configuration shown in FIG. 8. Each of the first and second spare cell arrays 112A and 112B includes twelve units 201. In FIG. 9, units $UX_3$ to $UX_6$ and $UX_{19}$ to $UX_{22}$ are dummy cells.

Further, in FIG. 9, a first spare plate line $SPL_1$ is located on the right of a sixth spare word line $SWL_6$, and a second spare plate line $SPL_2$ is located between a tenth spare word line $SWL_{10}$ and an eleventh spare word line $SWL_{11}$, corresponding to the circuit configuration shown in FIG. 8.

Furthermore, in FIG. 9, a third spare plate line $SPL_3$ is located between a second spare word line $SWL_2$ and a third spare word line $SWL_3$, and a fourth spare plate line $SPL_4$ is located on the left of a seventh spare word line $SWL_7$, corresponding to the circuit configuration shown in FIG. 8.

If the ferroelectric memory 101 of this embodiment is expressed like the modifications described in the second embodiment, the ferroelectric memory 101 of this embodiment has a circuit configuration in which the circuit configuration of the first embodiment is adopted for memory cells and that of the second embodiment is adopted for spare cells. Therefore, in FIG. 9, differently from FIGS. 3 and 6, some deviations between positions of ends of the spare blocks and positions of the spare plate lines are shown.

It is to be noted that redundancy repair according to the third embodiment can be executed similarly to those according to the first and second embodiments.

As stated above, in this embodiment, the blocks each including the six units 201, and the blocks each including the two units 201 are mixed together in one memory cell array. Nevertheless, in this embodiment, since the first to fourth spare blocks $SB_1$ to $SB_4$ are respectively used for redundancy repair of the first to fourth blocks $B_1$ to $B_4$, the number of the units 201 per row of each spare cell, array is such a small number as six at maximum. In this way, according to this embodiment, even if redundancy repair of a ferroelectric memory in which the blocks different in the number of the units are mixed together is to be dealt with, redundancy repair efficiency can be maintained and yield of LSI can be thereby improved, similarly to the first and second embodiments.

Fourth Embodiment

Figure 10:
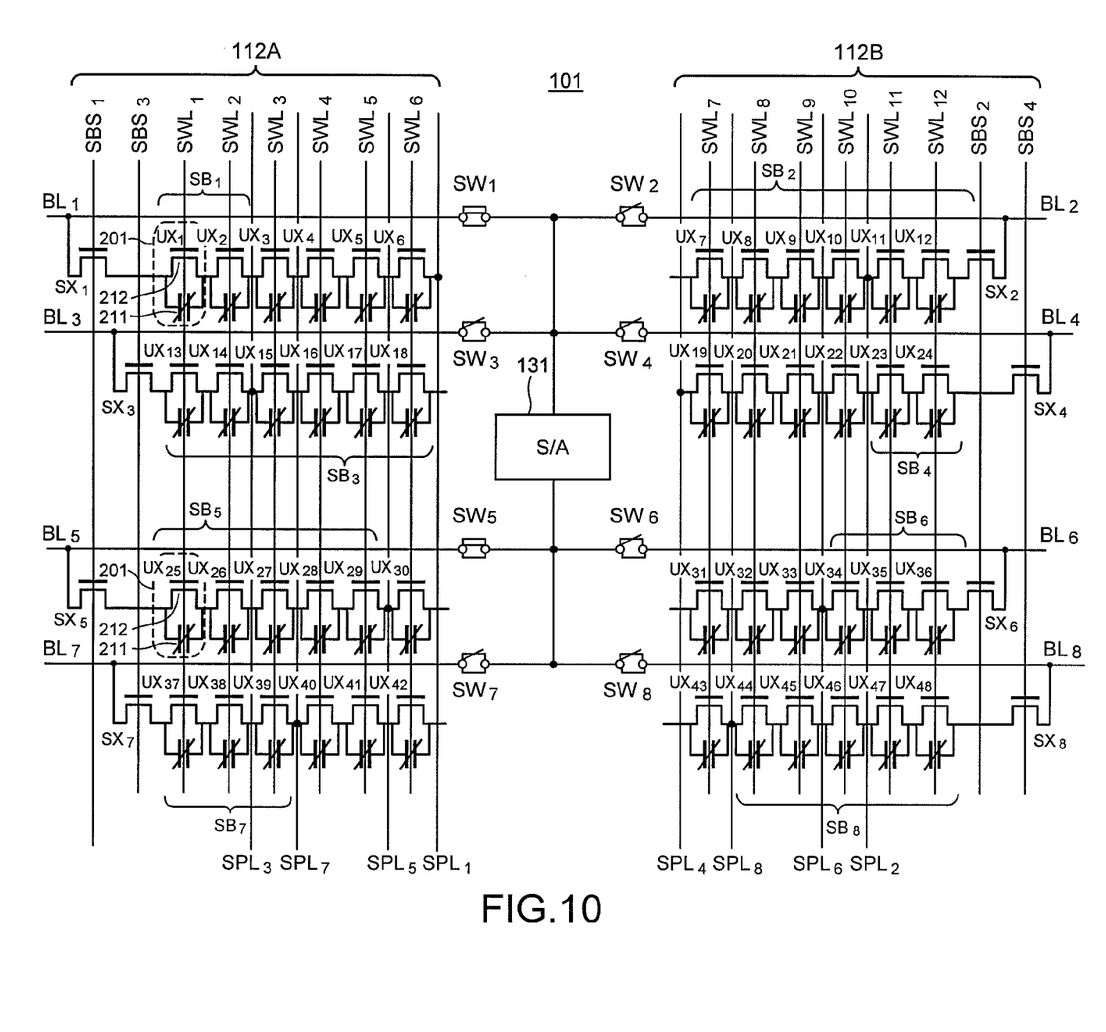
FIG. 10 is a circuit diagram showing a circuit configuration of first and second spare cell arrays according to a fourth embodiment.

FIG. 10 shows a circuit configuration of first and second spare cell arrays 112A and 112B according to a fourth embodiment. The circuit configuration shown in FIG. 10 is a modification of that shown in FIG. 3. It is to be noted that the circuit diagram of FIG. 1 is common to the first and fourth embodiments.

FIG. 10 shows 48 units $UX_1$ to $UX_{48}$ and first to eighth spare blocks $SB_1$ to $SB_8$.

The first to fourth spare blocks $SB_1$ to $SB_4$ include two, six, six, and two units 201, respectively. Dummy cells $UX_3$ to $UX_6$ are provided on the right of the first spare block $SB_1$, and dummy cells $UX_{19}$ to $UX_{22}$ are provided on the left of the fourth spare block $SB_4$. In this way, the first to fourth spare blocks $SB_1$ to $SB_4$ shown in FIG. 10 are identical in configuration to the first to fourth spare blocks $SB_1$ to $SB_4$ shown in FIG. 9.

Moreover, the fifth to eighth spare blocks $SB_5$ to $SB_8$ include five, three, three, and five units 201, respectively. A dummy cell $UX_{30}$ is provided on the right of the fifth spare block $SB_5$, and dummy cells $UX_{31}$ to $UX_{33}$ are provided on the left of the sixth spare block $SB_6$. Further, dummy cells $UX_{40}$ to $UX_{42}$ are provided on the right of the seventh spare block $SB_7$, and a dummy cell $UX_{43}$ is provided on the left of the eighth spare block $SB_8$. In this way, the fifth to eighth spare blocks $SB_5$ to $SB_8$ shown in FIG. 10 are identical in configuration to the first to fourth spare blocks $SB_1$ to $SB_4$ shown in FIG. 6. However, one additional dummy cell is connected to each of the fifth to eighth spare blocks $SB_5$ to $SB_8$ as compared with each of the first to fourth spare blocks $SB_1$ to $SB_4$ shown in FIG. 6, respectively.

In this way, the circuit configuration shown in FIG. 10 is a combination of the circuit configuration shown in FIG. 9 and that shown in FIG. 6. Such a configuration is adopted if, for example, the circuit configuration of the first memory cell array 111A is a combination of the circuit configuration shown in FIG. 8 and that shown in FIG. 5.

When the circuit shown in FIG. 10 operates, any one of pairs of the spare blocks $SB_1$ and $SB_2$, spare blocks $SB_3$ and $SB_4$, spare blocks $SB_5$ and $SB_6$, and spare blocks $SB_7$ and $SB_8$ is activated. As for the pairs which are not activated, bit lines connected to them are kept in standby states, or are used as reference bit lines.

As stated above, according to this embodiment, even if redundancy repair of a ferroelectric memory in which three or more types of blocks different in the number of the units are mixed together is to be dealt with, it is possible to maintain redundancy repair efficiency. For example, in FIG. 10, despite mixture of four types of blocks, the number of the units 201 per row of each spare cell array is such a small number as six at maximum.

As stated so far, according to the embodiments of the present invention, it is possible to provide techniques for redundancy repair applicable to even the ferroelectric memory in which the blocks different in the number of the units are mixed together.

While specific aspects of the present invention have been described so far by referring to the first to fourth embodiments, the present invention is not limited to these embodiments.

The invention claimed is:

1. A ferroelectric memory comprising a plurality of units, each unit comprising a ferroelectric capacitor and a transistor connected in parallel, the memory comprising:
   first and second memory cell arrays;
   first and second bit lines in the first and second memory cell arrays, respectively;
   first and second blocks connected to the first bit line, and comprising $N_1$ units and $N_2$ units, respectively, where $N_1$ and $N_2$ are positive integers;
   a first plate line in the first memory cell array, and connected to the first and second blocks in common;
   third and fourth bit lines in the first and second memory cell arrays, respectively;
   third and fourth blocks connected to the third bit line, and comprising $N_3$ units and $N_4$ units, respectively, where $N_3$ and $N_4$ are positive integers;
   a second plate line in the first memory cell array, and connected to the third and fourth blocks in common;
   a first redundant block connected to the first bit line, comprising $N_1$ units, and configured to be used for repairing the first block;
   a second redundant block connected to the second bit line, comprising $N_2$ units, and configured to be used for repairing the second block;
   a third redundant block connected to the third bit line, comprising $N_3$ units, and configured to be used for repairing the third block;
   a fourth redundant block connected to the fourth bit line, comprising $N_4$ units, and configured to be used for repairing the fourth block;

first to fourth redundant plate lines connected to the first to fourth redundant blocks, respectively; and a sense amplifier selectively connectable to one of the first and second bit lines, and selectively connectable to one of the third and fourth bit lines, wherein:
if $N_1$ is smaller than $N_3$, the ferroelectric memory comprises $(N_3-N_1)$ dummy units connected to the first redundant block,
if $N_1$ is greater than $N_3$, the ferroelectric memory comprises $(N_1-N_3)$ dummy units connected to the third redundant block,
if $N_2$ is smaller than $N_4$, the ferroelectric memory comprises $(N_4-N_2)$ dummy units connected to the second redundant block, and
if $N_2$ is greater than $N_4$, the ferroelectric memory comprises $(N_2-N_4)$ dummy units connected to the fourth redundant block.

2. The memory of claim 1, wherein
a total number of the units in the first and second blocks, $N_1+N_2$, is equal to a total number of the units in the third and fourth blocks, $N_3+N_4$.

3. The memory of claim 2, wherein
the number of the units in the first block, $N_1$, is different from number of the units in the third block, $N_3$, and
the number of the units in the second block, $N_2$, is different from number of the units in the fourth block, $N_4$.

4. The memory of claim 2, wherein
a difference in the number of the units between the first block and the second block, $|N_1-N_2|$, is equal to a difference in the number of the units between the third block and the fourth block, $|N_3-N_4|$.

5. The memory of claim 2, wherein
a difference in the number of the units between the first block and the second block, $|N_1-N_2|$, is different from a difference in the number of the units between the third block and the fourth block, $|N_3-N_4|$.

6. The memory according to claim 2, wherein
the total number of the units in the first and second blocks, $N_1+N_2$, is $2^n$, where n is a positive integer.

7. The memory according to claim 1, wherein
$2^k$ word lines comprising a word line comprising a defect are replaced by $2^k$ redundant word lines, where k is a positive integer.

8. The memory of claim 7, wherein
an address of each the word line in the first and second memory cell arrays is represented by N-bit data, where N is a positive integer, and
(N−k) high order bits from a highest order bit of the addresses are common to the $2^k$ word lines with regard to addresses of the $2^k$ word lines.

9. The memory of claim 8, wherein
whether the defect is on the word line is determined based on the (N−k) high order bits of the address of the word line.

10. The memory of claim 1, wherein
the first and third blocks are connected in common to at least one word line in the first memory cell array, and
the second and fourth blocks are connected in common to at least one word line in the first memory cell array.

11. The memory of claim 1, wherein
the first and third redundant blocks are connected in common to at least one redundant word line, and
the second and fourth redundant blocks are connected in common to at least one redundant word line.

12. The memory of claim 1, wherein
the $N_1$ units in the first block, and the $N_2$ units in the second block are connected in series, and
the $N_3$ units in the third block, and the $N_4$ units included in the fourth block are connected to one another in series.

13. The memory of claim 12, wherein
a first end of the first block, and a first end of the second block are connected to the first plate line,
a second end of the first block is connected to the first bit line via a first selection transistor in the first memory cell array,
a second end of the second block is connected to the first bit line via a second selection transistor in the first memory cell array,
a first end of the third block, and a first end of the fourth block are connected to the second plate line,
a second end of the third block is connected to the third bit line via a third selection transistor in the first memory cell array, and
a second end of the fourth block is connected to the third bit line via a fourth selection transistor in the first memory cell array.

14. The memory of claim 13, wherein
control terminals of the first to fourth selection transistors are connected to first to fourth block selection lines in the first memory cell array, respectively.

15. The memory of claim 13, wherein
the first and second selection transistors are connected to the $(N_1+N_2)$ units in the first and second blocks in series, and
the third and fourth selection transistors are connected to the $(N_3+N_4)$ units in the third and fourth blocks in series.

16. The memory of claim 1, wherein
the $N_1$ units in the first redundant block are connected in series,
the $N_2$ units in the second redundant block are connected in series,
the $N_3$ units in the third redundant block are connected in series, and
the $N_4$ units in the fourth redundant block are connected in series.

17. The memory of claim 1, wherein
first ends of the first to fourth redundant blocks are connected to the first to fourth redundant plate lines, respectively, and
second ends of the first to fourth redundant blocks are connected to the first to fourth bit lines via first to fourth redundant block selection transistors, respectively.

18. The memory of claim 17, wherein
control terminals of the first to fourth redundant block selection transistors are connected to first to fourth redundant block selection lines, respectively.

19. The memory of claim 17, wherein
the first redundant block selection transistor is connected to the $N_1$ units in the first redundant block in series,
the second redundant block selection transistor is connected to the $N_2$ units in the second redundant block in series,
the third redundant block selection transistor is connected to the $N_3$ units in the third redundant block in series, and
the fourth redundant block selection transistor is connected to the $N_4$ units in the fourth redundant block in series.

* * * * *